Figure 1:
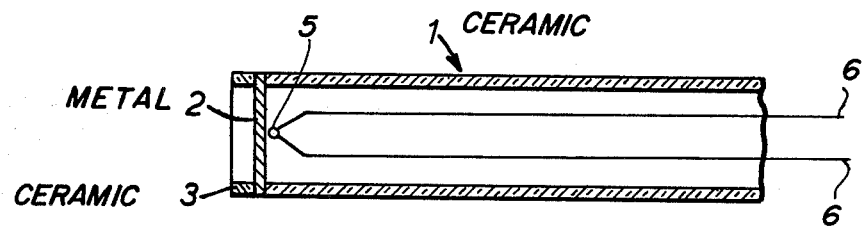

United States Patent [19]

Bailey et al.

[11] 4,238,957

[45] Dec. 16, 1980

[54] PYROMETRIC SHEATH AND PROCESS

[75] Inventors: Frank P. Bailey, Huntingdale; Clive K. Coogan, Canterbury, both of Australia

[73] Assignee: Commonwealth Scientific and Industrial Research Organization, Campbell, Australia

[21] Appl. No.: 919,832

[22] Filed: Jun. 28, 1978

[51] Int. Cl.³ .......................... G01K 1/08; G01K 7/00
[52] U.S. Cl. .............................. 73/343 R; 73/359 R; 136/232; 136/234
[58] Field of Search ................. 73/343 R; 204/195 R; 206/306; 136/230, 233, 242, 232

[56] References Cited

U.S. PATENT DOCUMENTS

| 1,847,059 | 2/1932 | Beshara | 136/230 X |
| 3,040,579 | 6/1962 | Taylor | 136/233 X |
| 3,298,874 | 1/1967 | Davies | 136/232 |
| 3,451,860 | 6/1969 | Schwartzwalder et al. | 136/230 |
| 3,473,968 | 10/1969 | Rinesch et al. | 136/230 |
| 3,668,099 | 6/1972 | Rittiger et al. | 204/195.5 |
| 3,699,032 | 10/1972 | Rapp | 204/195.5 |
| 3,758,397 | 9/1973 | Rittiger et al. | 204/195.5 |
| 3,929,018 | 12/1975 | Turner | 206/306 X |
| 3,946,610 | 3/1976 | Sartorius | 73/343 R |
| 4,050,956 | 9/1977 | de Bruin | 148/6 |

FOREIGN PATENT DOCUMENTS 452651 8/1972 Australia ............................ 204/195 X Primary Examiner—Daniel M. Yasich
Attorney, Agent, or Firm—Cushman, Darby & Cushman

[57] ABSTRACT

A pyrometric sheath in which, in order to, inter alia enhance the response time of the protected temperature sensor, a partition of relatively high thermal conductance is hermetically bonded to the surrounds of an opening in a thermally insulating body. In a preferred arrangement, a thin metal foil partition is chemically bonded to an insulating tube of a refractory oxide ceramic.

9 Claims, 1 Drawing Figure

PYROMETRIC SHEATH AND PROCESS

This invention relates to pyrometric devices and in particular to pyrometric sheaths, that is protective sheaths for thermometric and other measuring devices which are required to be used in hostile environments, e.g., under conditions of very low or very high temperatures and/or in corrosive atmospheres or liquids. The invention is also concerned with processes utilising such sheaths in high or low temperature applications.

Such pyrometric devices are widely used in the metallurgical, ceramic and glass-making arts. In making glass fibres, for example, it is important to have an accurate measure of temperature at the various stages of the process. In general, glass manufacturing and conversion processes involve furnace temperatures of the order of 1100°–1300° C. Also, because molten glass is both highly corrosive and conductive, it is not expedient to place a thermocouple, e.g., of platinum/platinum-alloy (Pt/Rh or Pt/Ir) directly in contact with the melt. Instead, the thermocouple is housed in a protective sheath, which usually consists of a tube of alumina or other refractory material which is closed at one end, i.e., the end which is immersed in the molten glass.

This arrangement suffers from the disadvantages that the response time of the thermocouple to variations in temperature in the medium to be monitored is greatly retarded due to the poor thermal conductivity of the alumina and the necessity to have the tube walls reasonably thick (ca. 1 or 2 mm) to achieve sufficient mechanical strength. Typically the time constant for such an arrangement is of the order of minutes, which means that the thermocouple will respond only slightly to temperature variations which occur over a time scale significantly less than the time constant of the thermocouple and sheath. Similar considerations apply when the sheath is used with alternative thermometric devices, such as thermistors.

One attempt to improve the performance of such probes in the glass industry has been to use an open-ended tubular ceramic sheath which is closed by a thimble of platinum which is a tight sliding fit within the tube. While this arrangement achieves a lower time constant for the probe, it involves the use of a relatively thick-walled (and hence expensive) preformed platinum thimble which, moreover, can be, and often is, lost out of the probe during insertion into or withdrawal from the glass tank. Furthermore, as the thimble is not firmly attached in the tube, there is always the possibility that molten glass can penetrate into the interior of the tube and destroy the thermocouple. Tubes formed entirely of suitable noble metals, such as platinum, have also been used but their cost is obviously prohibitive. Further, such tubes conduct heat to their point of attachment on the outer wall of the furnace, which makes mounting them difficult and gives rise to serious errors in the thermocouple readings.

An objective of the invention is to provide a pyrometric sheath which at least in part alleviates the problems associated with the prior art devices described above.

In accordance with one aspect of the present invention there is provided a pyrometric sheath which comprises a hollow body of a material having relatively poor thermal transmission qualities, and, disposed in an opening in the body, a partition of relatively high thermal conductance wherein the partition is hermetically bonded about its whole periphery to said body.

A preferred form of inventive pyrometric sheath comprises an elongated tubular body of refractory ceramic material, with the partition closing one end of the body. However, other arrangements are also possible; for example the tube may have a series of "porthole"-like partitions along its length or the partitions may be formed as one or more bands or rings wholly or partly encircling the tube. Other arrangements may also be envisaged, depending on the proposed application of the sheath.

Whatever its configuration, the sheath of the invention is characterized by an intimate hermetic bond between the hollow body and the partition, which is to be contrasted with the poor seal afforded by the aforedescribed thimble arrangement of the prior art. Obviously such a seal must remain intact at the expected operating temperatures and hence adhesives and other bonding media (including glass-to-metal) seals may be of no use at high temperatures.

The sheath may be of a refractory ceramic material and the partition a metal or ceramic foil. Under some circumstances, at least, the partition can be affixed by brazing techniques or other techniques known per se. We prefer however, to use seals which are formed by the direct interaction of the body and the metal foil or between the body and a metal foil in turn interacting with a suitable ceramic window such as Beryllia.

In Australian Pat. No. 452,651, there is described the formation of metal-ceramic bonds by heating metal/ceramic couples in air (or other atmospheres) at a temperature below the melting point of either material. A similar technique is described in U.S. Pat. No. 4,050,956. The technique is especially applicable to oxide ceramics formed from fused or sintered refractory oxides, especially the oxides of metals of Groups II,III,IV, and VIII of the Periodic Classification of the Elements (including certain metals of the rare earth and actinide series and metalloids, such as silicon), and to metals broadly those of the so-called "Transition Series" of the Periodic Classification of the Elements. For the purposes of this specification the transition elements concerned are those having atomic numbers between 21 and 29 inclusive in the first transition series; between 39 and 47 inclusive in the second transition series; and between 57 and 79 inclusive in the third transition series. Platinum and alumina are specifically known to bond by both of these techniques and hence such methods are especially favoured for the production of the sheaths which form a specific aspect of this invention.

Thus, in a preferred aspect of the invention, the partition is a foil of a metal of the Transition Series (as defined above) and the hollow body is a refractory oxide ceramic (as defined above) and said bond is at least in part of a kind formed by abutting a peripheral surface of the metal foil with an annular surface of the body of refractory oxide ceramic and heating at least the abutting surfaces to a temperature below the melting point of the lowest melting component of the system but sufficient to bring about a chemical reaction between the ceramic and metal components leading to the formation of said bond between the surfaces.

Where the partition is to be of a non-metallic material, e.g., beryllia, bonding of the partition to the body can be carried out by a similar technique, i.e., by interposing a thin foil of a suitable metal (e.g. platinum)

between the body and the partition, as described in our aforementioned Australian Patent.

Examples of refractory ceramic materials known per se to be useful in accordance with the present invention include alumina, aluminous porcelains, mullite, silica, zirconia and zirconia/alumina composites. As examples of partition materials there may be mentioned platinum, gold and the other noble metals and ceramics or other refractory materials having high thermal conductivity, such as beryllia and diamond. Obviously the choice of body and partition materials for the sheath will depend principally on the proposed application.

By virtue of the inventive structure, the thickness of the partition can be reduced to between 0.05 and 0.5 mm with advantageous results in regard to rate of thermal conduction and to response times of shielded devices. The advantage tends to be lost for thicknesses greater than 0.5 mm, while 0.05 mm is a minimum value for adequate strength and resilience.

Apart from the applications already described, the pyrometric sheath of the present invention can be used as a housing for a thermocouple or like device in a variety of applications, as a temperature measuring probe, i.e. in furnaces of many types, for measuring the temperature of solid, liquid or gaseous reactants. Such a probe is also useful in vacuum furnace applications, since the probe can readily be made vacuum-tight. It can also be useful for the measurement of temperature by radiation such as in a vacuum furnace, but also in other applications. In these latter applications, the partition may need to be suitably blackened and/or roughened to improve its response to incident radiation.

As especially suitable application is to glass manufacturing processes: in which case the materials of the sheath must be selected such that the sheath will withstand an environment at an operating temperature of the order of 1100° to 1300° C. for an extended period. A suitable such sheath is mullite with a platinum partition.

The sole FIGURE is a longitudinal sectional view of an end portion of a pyrometric sheath constructed in accordance with the invention.

The pyrometric sheath shown in the drawing basically comprises a tube of a refractory ceramic such as alumina 1 which may be about 10 mm in diameter, of such length as the application demands and which exhibits relatively poor thermal transmission properties. A partition of relatively high thermal conductance in the form of a thin metal foil 2, platinum for example, of suitable thickness (say 0.08 to 0.5 mm–0.003 to 0.03 in.). The material of the foil 2 is chosen so that it can be bonded to the annular end face of the tube 1 by the reaction bonding technique described in U.S. Pat. No. 4,050,956. Briefly, this involves placing a peripheral surface of the foil in contact with an annular surface afforded by the end of the tube, applying a light clamping pressure and heating the assembly to a temperature which is below the melting point of either component but is sufficient to bring about a chemical reaction between the ceramic and metal components leading to the formation of a bond between the surfaces. Because the metal will bond to any ceramic substrate under these conditions it is desirable for constructional purposes to back the foil with a thin ceramic ring (3) of, for example, alumina which thus becomes part of the final sheath assembly and, incidentally, acts as a protective collar around the partition.

In use, a thermocouple 5, or other pyrometric sensor is placed within the tube 1, with its sensitive element near or touching the partition 2 and its conductive leads 6 passing down the interior of the tube 1 to any suitable display and/or recording equipment (not shown). Heat is absorbed, conducted and re-emitted by the partition which can thus be said to act as a thermal window for the thermocouple. For some applications it may be desirable to have the thermocouple junction welded to the inner face of the partition 2 for optimum response.

EXAMPLE 1

To assess the thermal performance of a sheath of the form shown in the drawing. A thermocouple was placed within a mullite tube 10 mm in a diameter with a 1.5 mm wall thickness and having a platinum foil partition (0.08 mm thickness). The top of the thermocouple was positioned in the tube adjacent to the partition.

The thus-constituted probe at ambient temperature (20° C.) was plunged into boiling water and the time ($T_{\frac{1}{2}}$) taken for the thermocouple to register half the total temperature rise was recorded.

An identical test was performed using the thermocouple inside a standard closed-end mullite sheath with the same wall thickness and diameter. The results were as follows:

Standard Mullite probe (prior art): $T_{\frac{1}{2}} = 33$ seconds
Stand Mullite/Pt probe (invention): $T_{\frac{1}{2}} = 3$ seconds The comparison was repeated, using the same probes, in an air furnace operating at a base temperature of 900° C. and in this case an additional test was performed with the bare unsheathed thermocouple. The results were as follows:

Standard Probe (prior art): $T_{\frac{1}{2}} = 70$ seconds
Probe with Pt partition.: $T_{\frac{1}{2}} = 15$ seconds
Unsheathed thermocouple: $T_{\frac{1}{2}} = 20$ seconds It will be appreciated that the exact ratio of difference between $T_{\frac{1}{2}}$ for the standard ceramic sheathed thermocouple and $T_{\frac{1}{2}}$ for the inventively sheathed thermocouple will depend on numerous factors such as the temperature level of operation, the medium surrounding the sheath (e.g. air, hydrogen, water, molten glass etc.)

EXAMPLE 2

A sheath consisting of an alumina tube dimensioned as in Example 1 was provided with a partition in the form of a thin (0.08 to 0.18 mm–0.003 to 0.007 in.) sheet of gold foil in the form of a disc bonded to the end of the tube. The process of bonding was similar to that described in connection with Example 1 with bonding being produced at a temperature of about 1000° C. A sheath of this form is more appropriate than the platinum/mullite combination for use in, for example, sulphurous atmospheres.

We claim:

1. In a pyrometric sheath for temperature sensors comprising a hollow tubular body of a material having relatively poor thermal transmission qualities, and, disposed in an opening towards one end of the body to close the opening, a partition of relatively high thermal conductance having an outer face exposed to the exterior of the body and an inner face exposed to the hollow interior of the body, the improvement wherein, the partition is a metal foil disc of a thickness between 0.05 mm and 0.5 mm which includes a metal selected from the group consisting of metals having atomic numbers between 21 and 28 inclusive in the first transition series between 39 and 47 inclusive in the second transition series and between 57 and 79 inclusive in the third transition series, and which has a melting point not below 600° C., said hollow body is a refractory oxide ceramic selected from the group consisting of oxides of metals of groups II, III, IV, VIII of the Periodic Classification of the Elements and mixtures of such oxides; the partition is hermetically sealed about its whole periphery to said hollow body by being bonded thereto; and the partition is electrically and thermally isolated at said periphery.

2. The improvement of claim 1, wherein said hollow body is in the form of a tube across one end of which is disposed said partition.

3. The improvement of claim 1 wherein said hermetic seal comprises a bond formed by disposing a peripheral surface of the metal foil and an annular surface of the hollow body in abutting relationship and heating at least the abutting surfaces to a temperature below the melting point of the lowest melting component of the system but sufficient to bring about a chemical bonding between the ceramic and the metal thereby forming a hermetic seal between the surfaces.

4. The improvement of claim 1 wherein the metal foil is a platinum foil.

5. A pyrometric device comprising: a hollow tubular body of a refractory oxide ceramic selected from the group consisting of oxides of metals of groups II, III, IV and VIII of the Periodic Classification of the Elements and mixtures of such oxides, a partition disposed in an opening towards one end of the body to close the opening and comprising a metal foil disc of thickness between 0.05 mm and 0.5 mm including a metal selected from the group consisting of metals having atomic numbers between 21 and 29 inclusive in the first transition series between 39 and 47 inclusive in the second transition series and between 57 and 79 inclusive in the third transition series, which partition has an outer face exposed to the exterior of the body and an inner face exposed to the hollow interior of the body, has a melting point not below 600° C., is hermetically sealed about its whole periphery to said hollow body by being bonded thereto, and is electrically and thermally isolated at said periphery; and a temperature sensing element disposed within said hollow body in close proximity to said inner face of said partition.

6. The pyrometric device of claim 5, wherein said hollow body is in the form of a tube across one end of which is disposed said partition.

7. The pyrometric device of claim 5 wherein said hermetic seal comprises a bond formed by disposing a peripheral surface of the metal foil and an annular surface of the hollow body in abutting relationship and heating at least the abutting surfaces to a temperature below the melting point of the lowest melting component of the foil and hollow body but sufficient to bring about a chemical bonding between the ceramic and the metal thereby forming a hermetic seal between the surfaces.

8. In a pyrometric sheath for temperature sensors comprising a hollow tubular body of a refractory material having relatively poor thermal transmission qualities, and, disposed in an opening towards one end of the body to close the opening, a partition of relatively high thermal conductance having an outer face exposed to the exterior of the body and an inner face exposed to the hollow interior of the body, the improvement wherein; the partition is a metal foil disc of thickness between 0.05 mm and 0.5 mm, has a melting point not below 600° C., said hollow body is a refractory ceramic; and the partition is hermetically sealed about its whole periphery to said hollow body by being bonded thereto, and is electrically and thermally isolated at said periphery.

9. The improvement of claim 8, wherein said hollow body is in the form of a tube across one end of which is disposed said partition.

* * * * *

UNITED STATES PATENT AND TRADEMARK OFFICE
CERTIFICATE OF CORRECTION

PATENT NO. : 4,238,957
DATED : December 16, 1980
INVENTOR(S) : Frank P. Bailey and Clive K. Coogan It is certified that error appears in the above—identified patent and that said Letters Patent is hereby corrected as shown below:

On the front page format, after paragraph "[21]", insert:

--[30]  Foreign Application Priority Data
        July 4, 1977   Australia.........PD 0698/77--

Signed and Sealed this

Twenty-sixth Day of May 1981

[SEAL]

Attest:

RENE D. TEGTMEYER

*Attesting Officer*    *Acting Commissioner of Patents and Trademarks*